United States Patent
Hazucha et al.

(10) Patent No.: US 7,030,676 B2
(45) Date of Patent: Apr. 18, 2006

(54) TIMING CIRCUIT FOR SEPARATE POSITIVE AND NEGATIVE EDGE PLACEMENT IN A SWITCHING DC-DC CONVERTER

(75) Inventors: Peter Hazucha, Beaverton, OR (US); Gerhard Schrom, Hillsboro, OR (US); Tanay Karnik, Portland, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 10/748,298

(22) Filed: Dec. 31, 2003

(65) Prior Publication Data

US 2005/0140415 A1    Jun. 30, 2005

(51) Int. Cl.
*H03H 11/26* (2006.01)
(52) U.S. Cl. ...................... 327/263; 327/172
(58) Field of Classification Search ............. 327/172, 327/175, 176, 263, 276, 284, 291, 294, 299
See application file for complete search history.

(56) References Cited

U.S. PATENT DOCUMENTS

| 5,638,016 A * | 6/1997 | Eitrheim ............ 327/175 |
| 6,603,338 B1 * | 8/2003 | McClure ............ 327/172 |
| 6,940,326 B1 * | 9/2005 | Chen et al. ......... 327/166 |
| 2002/0083358 A1 * | 6/2002 | Otsuka ............ 713/401 |

* cited by examiner

*Primary Examiner*—Linh My Nguyen
(74) *Attorney, Agent, or Firm*—Fleshner & Kim LLP

(57) ABSTRACT

A timing circuit independently controls placement of the positive and negative edges of a periodic signal. This signal may then be used to control a wide variety of integrated circuit applications. The timing circuit includes separate programmable delay lines and a signal processor. Each delay line delays an input clock signal by a different increment of time. The signal processor then generates a timing signal from the clock signal, where the timing signal has a first edge controlled by the first delayed clock signal and a second edge controlled by the second delayed clock signal. The edges may be controlled so that the timing signal assumes different logical values for different amounts of time, thereby customizing the signal to any application. An example of one application includes using the timing signal control switching in a DC-DC converter.

38 Claims, 5 Drawing Sheets

US 7,030,676 B2

TIMING CIRCUIT FOR SEPARATE POSITIVE AND NEGATIVE EDGE PLACEMENT IN A SWITCHING DC-DC CONVERTER

BACKGROUND OF THE INVENTION

1. Field of the Invention

This invention generally relates to an apparatus and method for controlling the generation of timing signals.

2. Description of the Related Art

A wide variety of circuits for generating timing signals have been proposed. These signals have routinely been used as clock signals for synchronizing communications, storing, processing and coordinating the display of data, and performing numerous system management functions. Timing signals have also been used in asynchronous applications to control transistor switching in circuits that include, for example, signal-level converters, power converters, frequency generators, bias control circuits, as well as others.

In order to satisfy the performance requirements of many modern-day applications, it would be desirable to generate custom timing signals and more particularly ones having positive and negative edges which are independently controlled relative to one another. Signals of this type would improve the accuracy and efficiency of their host systems and thus would be regarded as highly desirable. Conventional circuits do not generate timing signals in this manner and therefore have proven to be a liability in many circuit designs.

DESCRIPTION OF THE PREFERRED EMBODIMENTS

Figure 1:
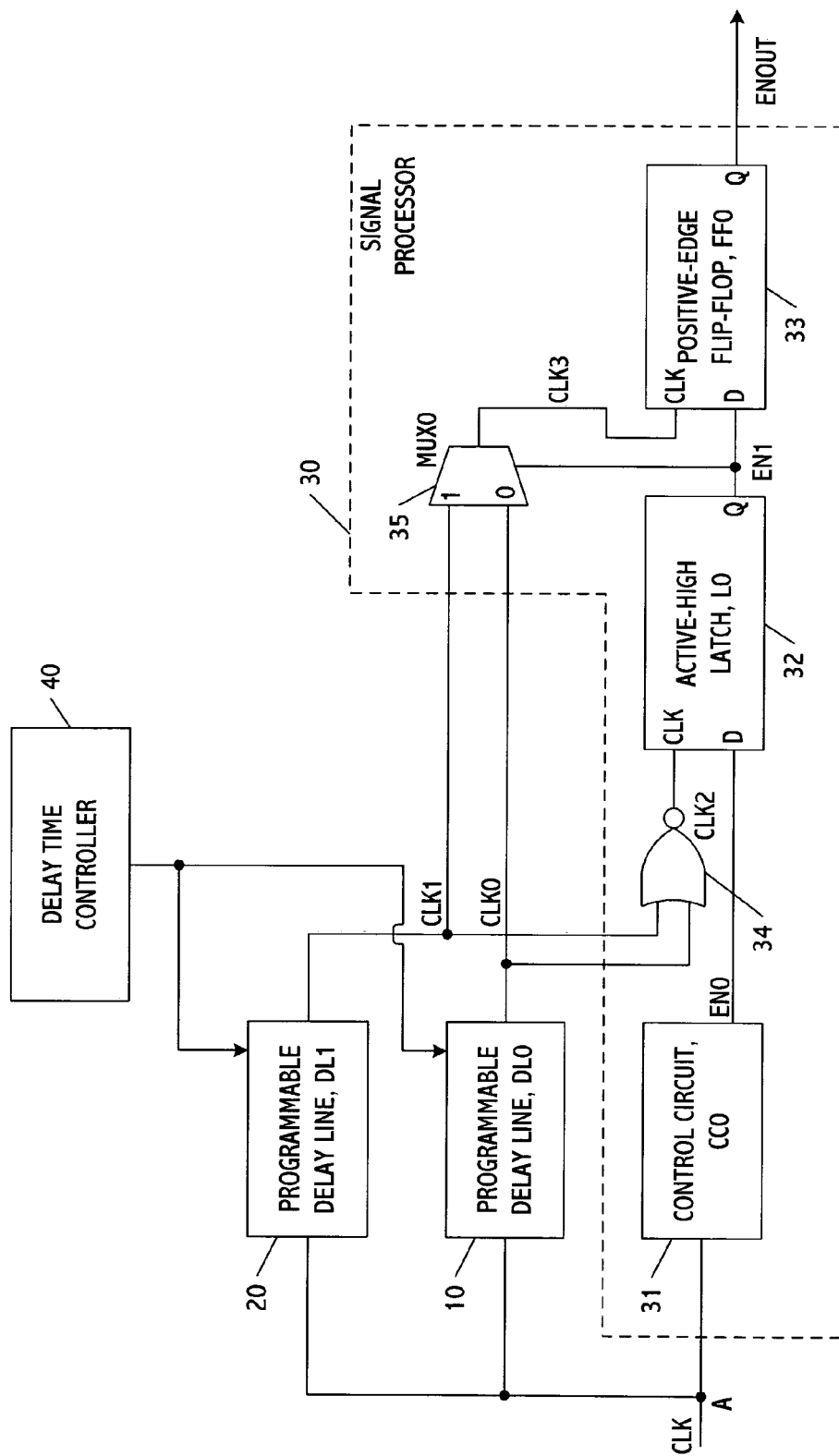
FIG. 1 is a diagram showing a circuit for controlling the generation of a timing signal in accordance with one embodiment of the present invention.

Referring to FIG. 1, a circuit for generating timing signals in accordance with one embodiment of the present invention includes a first delay line 10, a second delay line 20, and a signal processor 30 for generating a timing signal ENOUT from an input clock signal CLK and outputs from the delay lines.

The first and second delay lines are preferably programmable lines which control the delay imposed on the input clock signal. Each line may be formed from a plurality of series-connected delay elements (e.g., buffers) which are selectively connected in the circuit using, for example, logic gates to achieve a predetermined total delay time for the clock signal. While delay lines of this type are known, those skilled in the art can appreciate that other types of lines may be used provided they are capable of delaying the input clock signal in the manner described herein. The total delay time of each line may be set or otherwise adjusted by a controller 40.

The signal processor generates, from the input clock signal, a timing signal having rising and falling edges which are independently controlled based on the output of two delay lines. The rising and falling edges may correspond to different logic levels, and as such may reflect different states of a clock or effect different functions for controlling the operation of one or more circuits, one example of which is the DC-DC converter explained in greater detail below. By adjusting the delay times of each line, the rising and falling edges may be set to define any type of timing signal, including asymmetrical signals where the time the signal assumes a first logical value is different from the time the signal assumes a second logical value.

One preferred but non-limiting implementation of signal processor 30 includes a control circuit 31 (CCO), a first logic transfer circuit 32, and a second logic transfer circuit 33. The control circuit generates an interim timing signal EN0 having a predetermined period. The timing signal may be periodic or a periodic. For illustrative purposes, the interim timing signal is discussed herein as having a period (2T) that is approximately twice the period of the input clock signal (T). This is achieved by causing the interim signal to experience an edge transition at every controlling edge of the input clock signal, i.e., only one of the rising edge or falling edge of the clock signal controls edge transitions that take place for the periodic signal. In order to achieve this function, control circuit 31 is preferably formed from or includes a finite-state machine. Other types of signal processing or signal conversion circuits, however, may just as easily be used.

Once formed, timing signal EN0 is output with some delay relative to the controlling edge of the clock signal. The first and second transfer circuits buffer and shift logical values of this timing signal at times controlled by the delay times of clock signals CLK0 and CLK1. The first transfer circuit may be a latch circuit such as a active-high level-sensitive D latch. The second transfer circuit may be a positive-edge-triggered D flip-flop. While these circuits are preferable, other types of logic transfer circuits may be used. By controlling the delay times of clock signals CLK0 and CLK1 according to logical values of EN0, the falling and rising edges of timing signal ENOUT are independently adjusted with respect to CLK to meet the requirements of an intended application.

One way the logical values of timing signal EN0 may be buffered and shifted involves using logic gate 34 and multiplexer 35. The specific logic gate used depends whether the rising or falling edges of the delayed clock signals are used in activating the buffering function of the latch. In FIG. 1, logic gate 34 is shown as a NOR gate and latch 32 is compatibly selected to be an active-high latch. In this illustrative implementation, when the delayed clock values CLK0 and CLK1 both assume logical zero values, the NOR gate outputs a clock signal CLK2 having a logical one value. This value activates the latch to store the logical value of EN0 that exists at that time.

The logical value of EN0 is also passed to the Q output of the latch to serve as a select signal EN1 for the multiplexer. The multiplexer outputs one of the delayed clock signals based on the value of EN1. For example, if EN1 has a low logical value, the multiplexer outputs delayed clock signal CLK0. Conversely, if EN1 has a high logical value, the multiplexer outputs delayed clock signal CLK1.

The second transfer circuit may be a D-type flip-flop connected to receive the Q output of the latch. This flip-flop is activated by a signal CLK3 which corresponds to the signal output from the multiplexer. The flip-flop may be triggered on a rising or positive edge of the signal input into its clock terminal. When this triggering occurs, the logical value of EN1 in existence at that time is used as a basis for defining the first edge transition of the timing signal ENOUT.

For example, if ENOUT previously assumed a high logical value and EN1 has a low logical value at the time CLK3 goes high, then ENOUT will transition to a low logical value. Since EN1 is low, CLK3 is equivalent to CLK0 delayed by a small delay of multiplexer 35. Therefore, the transition time of ENOUT from high to low, or negative edge, is determined by delay line 10. Similarly, if ENOUT is low and EN1 is high, the time when CLK3 triggers the transition on ENOUT from low to high is determined by CLK1 and delay line 20. If EN1 and ENOUT have identical logical values, then either of CLK0 and CLK1 can be used to produce CLK3, since ENOUT will not exhibit a transition. The changing states and delay times imposed on CLK0 and CLK1 thus independently control the placement of the falling and rising edges of the output timing signal.

Figure 2:
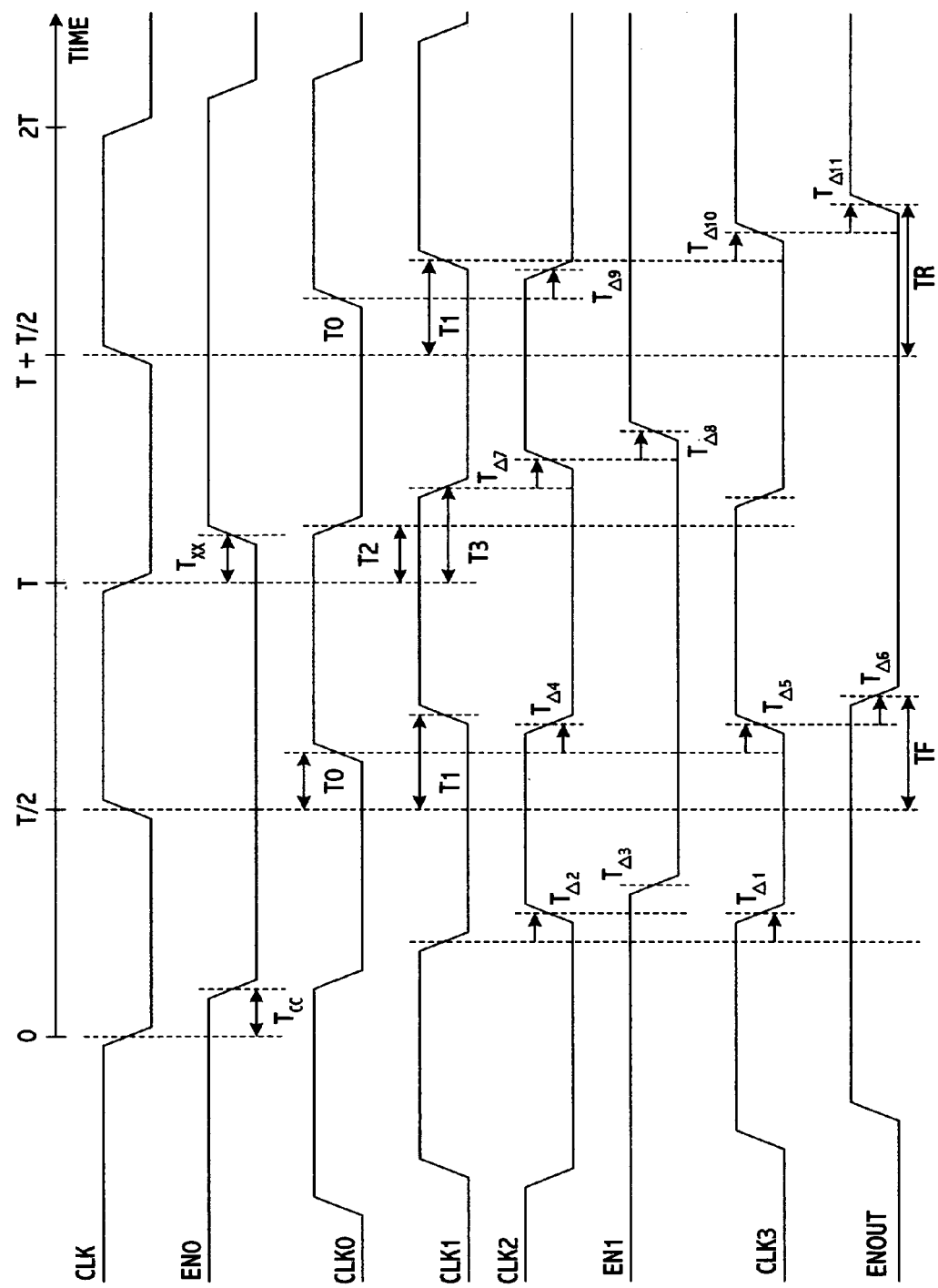
FIG. 2 is a timing diagram showing one way the circuit of FIG. 1 may be operated for generating a timing signal having independently controlled rising and falling edges.

FIG. 2 is a timing diagram showing how the FIG. 1 circuit may be operated under an exemplary set of conditions to generate a timing signal from an input clock signal, where the timing signal has falling and rising edges that are independently controlled based on the signals output from delay lines 10 and 20.

Initially, a clock signal CLK of period T is input into the signal processor and delay lines. In the signal processor, control circuit 31 causes timing signal EN0 to transition from a high to a low logical value when the falling edge of the clock signal occurs. This transition takes place after a delay time illustratively labeled $T_{cc}$. Simultaneously, delay lines 10 and 20 delay the clock signal by different amounts of time $T_0$ and $T_1$ to generate delayed clock signals CLK0 and CLK1 respectively.

At the time when CLK1 goes low, EN1 is high and multiplexer 35 outputs CLK1 as CLK3 and after short time $T_{A1}$, CLK3 also transitions from high to low.

When both delayed clock signals assume low logical values, NOR gate 34 outputs a high logical value as signal CLK2. As shown in the timing diagram, generation of this signal occurs a short time $T_{A2}$ after both of the delayed clock signals assume a low logical state. The transition of CLK2 to a high logical state activates latch 32, causing it to store the logical value of timing signal EN0 at this time. As shown, signal EN0 has a low logical value at this time. Accordingly, a logical value low is stored in the latch.

The high value of CLK2 also causes the latch to output a low logical value at its Q terminal. This value corresponds to the generation of timing signal EN1, after an additional delay time $T_{A3}$, which operates both as a select signal for multiplexer 35 and an input signal into flip-flop 33. Both delayed clock signals being low is a necessary prerequisite in this illustrative embodiment for generating the select signal EN1 of the multiplexer.

The low logical value of EN1 causes delayed clock signal CLK0 to be selected in multiplexer 35 in the anticipation of a high to low transition of ENOUT. Also, at this time, the low logical value of EN1 is not stored in flip-flop 33. This is because the flip-flop is a positive edge-triggered circuit and the clock input CLK3 is presently at a low value.

At time=T/2, clock signal CLK transitions to a high logical value. This event has no effect on timing signal EN0 because control circuit 31 only changes EN0 on the falling edge of the clock signal. (In the timing diagram, this point in time is labeled to show the delay times $T_0$ and $T_1$ of the clock signals CLK0 and CLK1 output from the delay lines.)

At time=T/2+T0, delayed clock signal CLK0 transitions to a high logical value. This causes clock signal CLK2 to assume a low value, which occurs after a delay time $T_{A4}$. Since EN1 is low at this time, multiplexer 35 outputs CLK0 as CLK3 and CLK3 transitions to high after time $T_{A5}$. Positive edge on CLK3 makes flip-flop 33 store the present logical value (i.e. high) of EN1 and output same value at ENOUT after a short time $T_{A6}$. The total delay, TF, from the rising edge of CLK at time=T/2 until the falling edge of ENOUT is substantially TF=T0+$T_{A5}$+$T_{A6}$ and is determined by delay T0 of delay line 10.

At time=T/2+T1, delayed clock signal CLK1 transitions to a high logical value.

When CLK2 goes low, latch 32 is de-activated. Because the Q output of the latch is unaffected by de-activation of the latch, timing signal EN1 retains its low logical value and thus delayed clock signal CLK0 continues to be selected by the multiplexer.

At time=T, the clock signal CLK goes low. This causes a rising edge transition to occur in timing signal EN0 output from control circuit 31. This transition occurs a delay time $T_{xx}$ after the falling edge transition of CLK. The value of $T_{xx}$ may be equal to $T_{cc}$ or may be a different delay time. Because clock signal CLK2 still has a low logical value, the change in logical state of signal EN0 is not yet reflected in the output of the latch.

The falling edge of clock signal CLK also causes delayed clock signals CLK0 and CLK1 to go low respective delay times T2 and T3 after the CLK falling edge transition. The values of T2 and T3 may match times T0 and T1, or T2 and T3 may be different from T0 and T1. After CLK0 goes low, CLK3 goes low because EN1 is low. A delay time $T_{66\ 7}$ after both delayed clock signals assume low logical values, the NOR gate outputs a high logical value at CLK2.

After CLK2 goes high, the latch stores the high logical value for timing signal EN0 and further shifts this value to its Q output. As a result, signal EN1 goes high a delay time $T_{A8}$ thereafter. The high value for EN1 causes the multiplexer to select the delayed clock signal CLK1 as its output, which as shown in the timing diagram has a low logical value.

When delayed clock signal CLK0 transitions to a high value again, the NOR gate outputs a low logical value for CLK2 after a delay time $T_{A9}$. This de-activates the latch while still making the high value of EN1 available at the Q output. Then, when delayed clock signal CLK1 goes high, CLK3 also goes high a delay time $T_{A10}$ thereafter. The high logical value of CLK3 activates the flip-flop to thereby cause timing signal ENOUT to assume the logical value of timing signal EN1. Since EN1 is high at this time, ENOUT experiences a rising edge transition a delay time $T_{A11}$ thereafter. The total delay, TR, from the rising edge of CLK at time=T+T/2 until the rising edge of ENOUT is substantially TR=T1+$T_{A10}$+$T_{A11}$ and is determined by delay T1 of delay line 20.

The transition of ENOUT to a high logical value thus marks the period for the timing signal output from the circuit of FIG. 1. As shown, the delay time TR of this rising edge transition is different from (and in this illustrative example longer than) the falling-edge transition delay time TF. The input clock signal CLK is therefore used as a basis for generating an asymmetrical timing signal, where the rising and falling edges are independently set relative to CLK based on the different delay times imposed by the programmable delay lines and where the time signal ENOUT assumes a high logical value is different from the time this signal assumes a low logical value. Although T0<T1 in FIG. 2, this is not a requirement. In other embodiments, T0=T1 or T0>T1 may be possible. Also, though preferred, it is not required that the duty cycle of CLK, CLK0 and CLK1 be substantially equal to 50%.

The timing circuit of the aforementioned embodiment, thus, independently controls the formation and placement of the rising (positive) and falling (negative) edges of the timing signal. This is accomplished using programmable delay lines (which may be identical circuits) set to different delay values. Through the independent control provided by the delay lines, the delays TR and TF for the positive and negative edges of the timing signal may be set to the same value or different values within a matching accuracy of two delay blocks. These values may be nearly arbitrarily selected and large differences in delays are easily achievable. Also, because the setting of one edge does not affect delay of the other edge, no sensitivity to systematic skews of the manufacturing process are realized.

The timing circuit of the aforementioned embodiment may be modified in several ways. For example, the delay lines may be set to the same delay values. In this case, the differences in path length between node A and each of the delay lines are relied upon to cause the delayed clock signals CLK0 and CLK1 to differ from one another. In another modification, latch 32 may be an active-low latch and gate 34 may be a NAND gate. Subsequent portions of the circuit may then be modified to be compatible with these changes. In another modification, the rising and falling edges of the timing signal may be reset or otherwise altered based on control signals from controller 40. As shown in FIG. 1, these control signals may change one or more of the delay times of the delay lines to new values to generate newly positioned edges in the timing signal. These control signals may be preprogrammed into the controller or may be issued in response to a user input or command.

Figure 3:
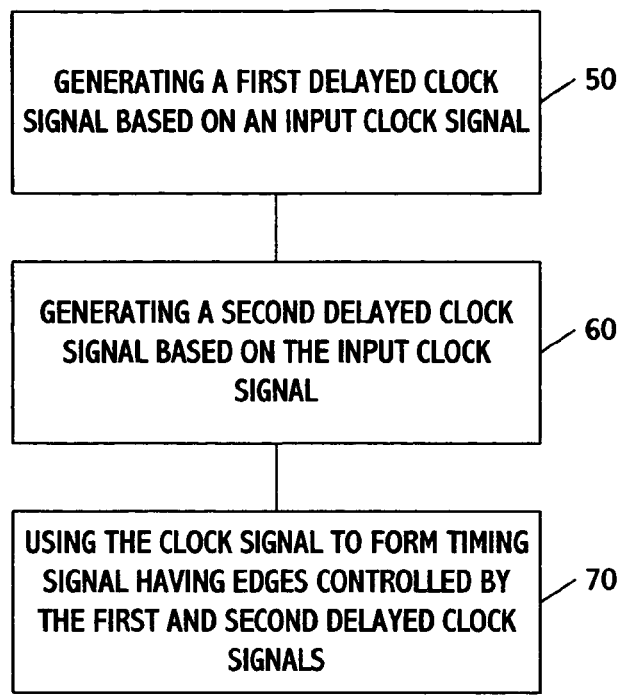
FIG. 3. shows functional blocks included in a method for generating timing signals in accordance with one embodiment of the present invention.

FIG. 3 shows functional blocks included in one embodiment of a method for generating timing signals in accordance with the present invention, which functional blocks may be performed by the circuit of FIG. 1 based on the timing diagram of FIG. 2. The method initially involves delaying a clock signal by a first amount to form a first delayed clock signal (Block 50), delaying the clock signal by a second amount to form a second delayed clock signal (Block 60), and generating a timing signal from the clock signal, wherein the timing signal has a first edge controlled by the first delayed clock signal and a second edge controlled by the second delayed clock signal (Block 70).

In Block 70, the timing signal is generated so that it assumes different logical values over its time period. The timing signal may be periodic or a periodic. In the FIG. 1 embodiment, the timing signal is illustratively shown to have a period (2T) substantially twice that of the input clock signal. The period of the timing signal may be other multiples or fractions of T. Also, the timing signal may be generated so that it is asymmetrical, i.e., assumes a first logical value for a longer duration than a second logical value over its time period. Optionally, the method may further include changing at least one of the delay line times in order to adjust one or more of the edges of the timing signal to predetermined positions.

Figure 4:
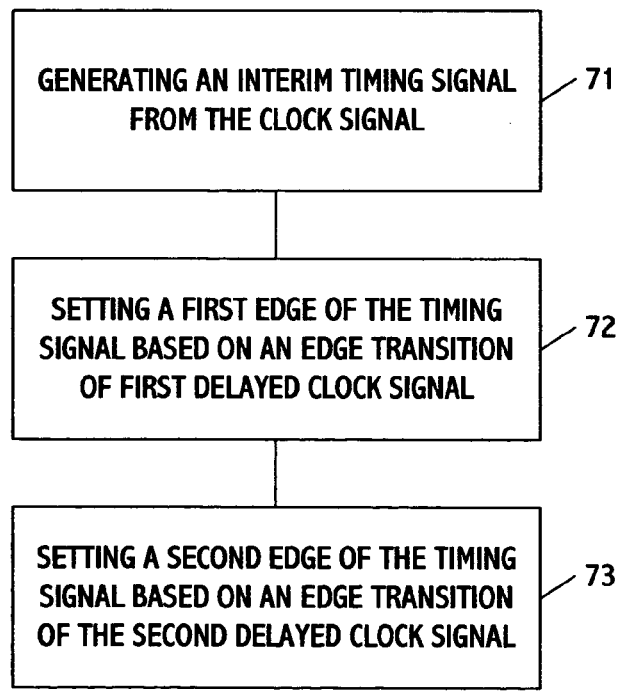
FIG. 4 shows functional blocks which may be performed in the clock-signal conversion block of FIG. 3.

FIG. 4 shows one way in which generation of the timing signal may take place in Block 70. Once the clock signal CLK is received, it is used as a basis for generating an interim timing signal having a period longer than the period of the clock signal and preferably a predetermined multiple of this period. (Block 71). The interim timing signal is then used as a basis for forming the output timing signal ENOUT. This may be accomplished as follows.

First, the first edge of the timing signal to a logical value of the interim timing signal is set based on an edge transition of the first delayed clock signal (Block 72). This is illustratively shown in the timing diagram of FIG. 2, where the falling edge of the timing signal ENOUT transitions to the low logical value of signal EN1 shortly after delayed clock signal CLK0 goes high. While the first delayed clock signal undergoes multiple edge transitions, the edge transition which sets the first edge of the timing signal is controlled by NOR gate, multiplexer, latch and flip-flop in the manner previously described.

Second, the second edge of the timing signal to a logical value of the interim timing signal is set based on an edge transition of the second delayed clock signal (Block 73). This is illustratively shown in the timing diagram of FIG. 2, where the rising edge of timing signal ENOUT transitions to the high logical value of EN1 shortly after the delayed clock signal CLK1 goes high. While the second delayed clock signal undergoes multiple edge transitions, the edge transition which sets the second edge of the timing signal is controlled by NOR gate, multiplexer, latch and flip-flop in the manner previously described.

Figure 5:
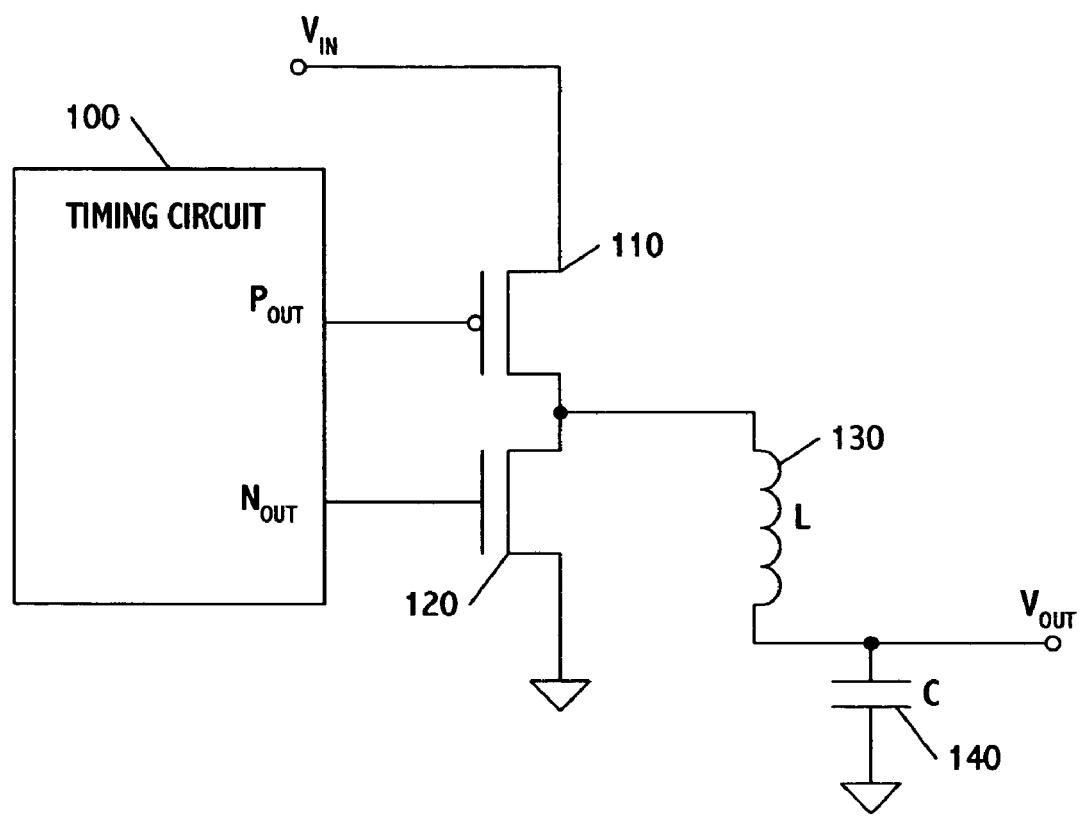
FIG. 5 is a diagram showing a DC-DC converter which includes a timing circuit in accordance with one or more of the embodiments of the present invention.

FIG. 5 shows a DC-DC converter implemented in CMOS in accordance with one embodiment of the present invention. The converter includes a timing circuit 100, a pair of series-connected transistors 110 and 120, and a LC circuit formed from an inductor 130 and a capacitor 140. The timing circuit corresponds to one or more embodiments of the present invention described herein, except that it has been adapted to output two gate control signals $P_{out}$ and $N_{out}$. These gate control signals are always set to the same logical value based on the timing signal output from circuit 100, e.g., when timing signal ENOUT is low both $P_{out}$ and $N_{out}$ are low and when ENOUT is high both $P_{out}$ and $N_{out}$ are high. Since the converter is implemented in CMOS, when P transistor 110 is switched on, N transistor 120 is switched off and vice versa.

The DC-DC converter operates to convert an input voltage $V_{in}$ at one DC level to an output voltage $V_{out}$ at another DC level. When $P_{out}$ and $N_{out}$ are low, transistor 110 is on and transistor 120 is off. This switching configuration causes voltage substantially equal $V_{in}-V_{out}$ to appear across the inductor terminals, which in turn causes a gradual increase in current flowing through the inductor to $V_{out}$. When $P_{out}$ and $N_{out}$ are high transistor 110 is off and transistor 120 is on. This switching configuration causes voltage substantially equal $(-V_{out})$ to appear across the inductor terminals, which in turn causes a gradual decrease in current flowing through the inductor to $V_{out}$. Because current through the inductor varies with time, output voltage $V_{out}$ may experience a ripple. Larger values of inductor 130 or capacitor 140 result in a smaller ripple. The average value of $V_{out}$ is substantially equal to the time-averaged voltage at the inductor terminal connected to transistors 110 and 120 and thus depends on the edge placement and duty cycle of signals $P_{out}$ and $N_{out}$.

Because the timing signal may assume different logical values for different durations and these durations can be independently controlled, circuit 100 can separately program the turn-on and turn-off instants of the switching transistors. This leads to improved timing accuracy for switching the transistors, which, in turn, prevents energy loss and power conversion efficiency degradations that other DC-DC converters which employ dependent transistor switching schemes experience. The embodiments of the timing circuit described herein may also be adapted to other applications where, for example, duty-cycle corrections are required.

In an alternative embodiment, the circuit would actually include two identical instances of the timing circuit shown in FIG. 1. Four delay lines would therefore be used. In operation, the two signals ENOUT generated from the two timing circuits would correspond to $P_{out}$ and $N_{out}$ respectively. The timing signal ENOUT generated for the $P_{out}$ signal would have a value which turns transistor 110 on substantially when transistor 120 is off. And, the timing signal ENOUT generated for the $N_{out}$ signal would have a value which turns transistor 120 on substantially when transistor 110 is off. Using these circuits, independent setting of the rising and falling edges of the gate signals for transistors 110 and 120 can therefore be achieved.

Figure 6:
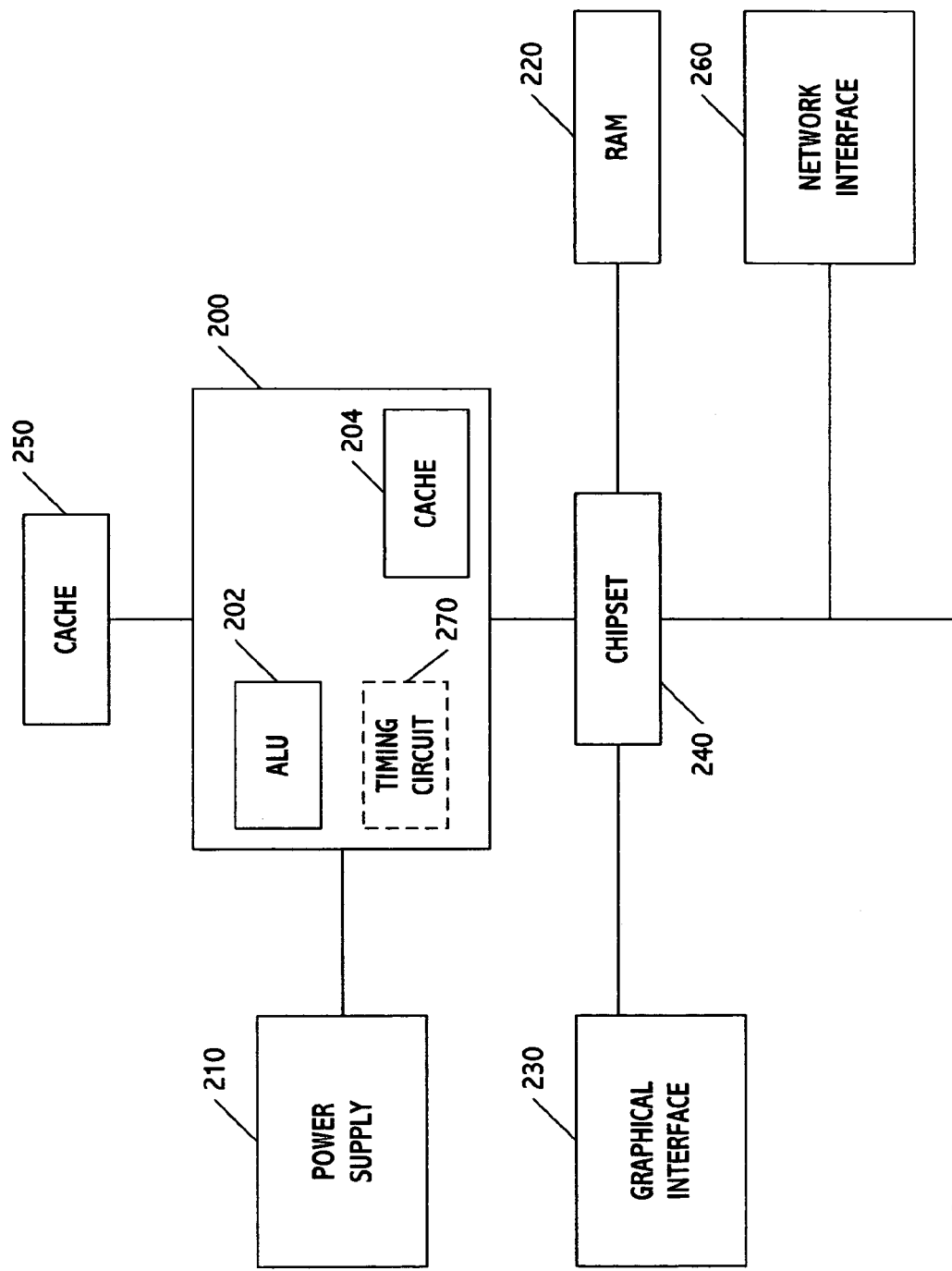
FIG. 6 is a diagram showing a processing system which may include the DC-DC converter and/or a timing circuit in accordance with one or more of the embodiments of the present invention.

FIG. 6 shows a processing system which corresponds to another application of the timing circuit. In accordance with one embodiment, the processing system includes a processor 200, a power supply 210, and a memory 220 which, for example, may be a random-access memory. The processor may include an arithmetic logic unit 202 and an internal cache 204. In addition to these elements, the processing system may optionally include a graphical interface 230, a chipset 240, a cache 250 and a network interface 260.

A timing circuit 270 in accordance with any one or more of the embodiments described herein may be used to generate timing and/or clock signals for controlling operations of the chipset or processor, or for controlling the transfer of data between either of these elements and the memory. The timing circuit is illustratively shown as being included in the processing system. Those skilled in the art can appreciate, however, that this circuit may be included in the chipset, network interface, or any of the other features of the processing system for performing any one of a variety of timing and/or control functions. Moreover, the processing system including the timing circuit may be formed on a single chip die or one or more elements of the system may reside off-chip.

Other modifications and variations to the embodiments of the present invention described herein will be apparent to those skilled in the art from the foregoing disclosure. Thus, while only certain embodiments of the invention have been specifically described herein, it will be apparent that numerous modifications may be made thereto without departing from the spirit and scope of the embodiments of the invention.

We claim:

1. A circuit, comprising:
   a first delay line to delay a clock signal by a first amount of time;
   a second delay line to delay the clock signal by a second amount of time;
   a signal processor to generate a timing signal from the clock signal, the timing signal having a first edge controlled by the delayed clock signal generated by the first delay line and a second edge controlled by the delayed clock signal generated by the second delay line, wherein the signal processor includes:
   a control circuit to generate an interim timing signal from the clock signal, the interim timing signal having edge transitions which coincide with one of a falling edge and a rising edge of the clock signal; and
   a timing circuit to generate the timing signal from the interim timing signal, and wherein the interim timing signal has a period which is substantially twice as long as the period of the clock signal.

2. The circuit of claim 1, wherein the timing circuit sets the first edge of the timing signal based on an edge transition of the delayed clock signal generated by the first delay line, and sets the second edge of the timing signal based on an edge transition of the delayed clock signal generated by the second delay line.

3. The circuit of claim 2, wherein the first edge of the timing signal corresponds to a logical value of the interim timing signal that exists at the time of the edge transition of the delayed clock signal generated by the first delay line, and wherein the second edge of the timing signal corresponds to a logical value of the interim timing signal that exists at the time of the edge transition of the delayed clock signal generated by the second delay line.

4. The circuit of claim 3, further comprising:
   a first logical transfer circuit to store said logical values of the interim timing signal prior to respective edge transitions of the delayed clock signals generated by the first and second delay lines, said first logical transfer circuit introducing delay that contributes to setting of the first and second edges of the timing signal.

5. The circuit of claim 4, further comprising:
   a second logical transfer circuit to output the timing signal based on said logical values stored in the first logical transfer circuit.

6. The circuit of claim 5, wherein the first logical transfer circuit includes a latch and the second logical transfer circuit includes a flip-flop.

7. A signal processing method, comprising:
   delaying a clock signal by a first amount to form a first delayed clock signal;
   delaying the clock signal by a second amount to form a second delayed clock signal; and
   generating a timing signal from the clock signal, the timing signal having a first edge controlled by the first delayed clock signal and a second edge controlled by the second delayed clock signal, wherein generating includes:
   forming an interim timing signal from the clock signal, the interim timing signal having edge transitions which coincide with one of a falling edge and a rising edge of the clock signal; and
   generating the timing signal from the interim timing signal, wherein the interim timing signal is periodic with a period which is substantially twice as long as the period of the clock signal.

8. The method of claim 7, wherein the timing signal assumes different logical values over a predetermined time period.

9. The method of claim 8, wherein the timing signal assumes a first logical value for a longer duration than a second logical value over the time period.

10. The method of claim 7, wherein generating the timing signal includes:
    setting the first edge of the timing signal based on an edge transition of the first delayed clock signal; and
    setting the second edge of the timing signal based on an edge transition of the second delayed clock signal.

11. The method of claim 10, wherein the first edge of the timing signal corresponds to a logical value of the interim timing signal that exists at the time of the edge transition of the first delayed clock signal, and wherein the second edge of the timing signal corresponds to a logical value of the interim timing signal that exists at the time of the edge transition of the second delayed clock signal.

12. The method of claim 11, further comprising:
storing said logical values of the interim timing signal in a latch prior to respective edge transitions of the first and second delayed clock signals, said storing introducing delay that contributes to setting of the first and second edges of the timing signal.

13. The method of claim 7, further comprising:
changing at least one of the first and second amounts of delay to adjust a position of at least a corresponding one of the first and second edges of the timing signal.

14. A circuit, comprising:
a switch; and
a timing circuit to control input of a voltage signal through the switch, said timing circuit including:
a first delay line to delay a clock signal by a first amount of time,
a second delay line to delay the clock signal by a second amount of time, and
a signal processor to generate a timing signal from the clock signal, the timing signal having a first edge controlled by the delayed clock signal generated by the first delay line and a second edge controlled by the delayed clock signal generated by the second delay line, wherein different portions of the timing signal independently control input of the voltage signal through the switch.

15. The circuit of claim 14, wherein a first portion of the timing signal assumes a first logical value for a first period of time and a second portion of the timing signal assumes a second logical value for a second period of time different from the first period of time, and wherein the first logical value of the timing signal controls input of the voltage signal through the switch for the first period of time and the second logical value of the timing signal places the switch in an open position for the second period of time.

16. The circuit of claim 15, wherein the circuit is a converter which includes an LC circuit coupled to the switch, and wherein a DC level of the voltage signal is converted into a different DC level based on control of the switch by the timing signal.

17. A method, comprising:
delaying a clock signal by a first amount to form a first delayed clock signal;
delaying the clock signal by a second amount to form a second delayed clock signal;
generating a timing signal from the clock signal, the timing signal having a first edge controlled by the first delayed clock signal and a second edge controlled by the second delayed clock signal; and
controlling input of a voltage signal into a level converter based on the timing signal, wherein different portions of the timing signal independently control switching of the voltage signal into the level converter.

18. The method of claim 17, wherein a first portion of the timing signal assumes a first logical value for a first period of time and a second portion of the timing signal assumes a second logical value for a second period of time different from the first period of time.

19. The method of claim 18, wherein controlling input of the voltage signal includes:
connecting the voltage signal to the level converter through a switch for the first period of time based on the first logical value of the timing signal; and placing the switch in an open position for the second period of time based on the second logical value of the timing signal.

20. The method of claim 17, wherein the level converter converts a DC level of the voltage signal into a different DC level.

21. A circuit, comprising:
a first delay line to delay a clock signal by a first amount of time;
a second delay line to delay the clock signal by a second amount of time; and
a signal processor to generate:
a) a first timing signal from the clock signal,
b) a second timing signal having edge transitions controlled by the first timing signal at times determined by a logical combination of the delayed clock signals from the first and second delay lines, and
c) a third timing signal having edge transitions controlled by the second timing signal at times determined by one of the delayed clock signals from the first and second delay lines, wherein the first timing signal has a period which is a number of times longer than the clock signal.

22. The circuit of claim 21, wherein said number is at least substantially two.

23. The circuit of claim 21, wherein the signal processor includes:
a first logical circuit to control the edge transitions of the second timing signal based on logical values of the first timing signal at times determined by a logical combination of the delayed clock signals.

24. The circuit of claim 23, wherein the first logical circuit controls the edge transitions of the second timing signal based on logical values of the first timing signal at times when the delayed clock signals have a same logical value.

25. A comprising:
a first delay line to delay a clock signal by a first amount of time;
a second delay line to delay the clock signal by a second amount of time; and
a signal processor to generate:
a first timing signal from the clock signal,
a second timing signal having edge transitions controlled by the first timing signal at times determined by a logical combination of the delayed clock signals from the first and second delay lines, and
c) a third timing signal having edge transitions controlled by the second timing signal at times determined by one of the delayed clock signals from the first and second delay lines, wherein the signal processor includes:
a first logical circuit to control the edge transitions of the second timing signal based on logical values of the first timing signal at times determined by a logical combination of the delayed clock signals, wherein the first logical circuit includes a data input coupled to receive the first timing signal and a clock input coupled to receive a signal indicative of a logical combination of the delayed clock signals.

26. The circuit of claim 23, wherein the signal processor further includes:
a second logical circuit to control the edge transitions of the third timing signal based on logical values of the second timing signal at times determined by one of the delayed clock signals from the first and second delay lines.

27. The circuit of claim 26, wherein a different one of the delayed clock signals determines when the second logical circuit controls the edge transitions of the third timing signal at different times.

28. The circuit of claim 26, wherein the second timing signal determines which one of the delayed clock signals controls when the second logical circuit sets the edge transitions of the third timing signal based on logical values of the second timing signal.

29. The circuit of claim 26, wherein the second logical circuit includes a data input coupled to receive the second timing signal and a clock input coupled to a multiplexer, the multiplexer selecting for output one of the delayed clock signals based on a logical value of the second timing signal.

30. A circuit comprising:
a first delay line to delay a clock signal by a first amount of time;
a second delay line to delay the clock signal by a second amount of time;
a signal processor to generate:
a) a first timing signal from the clock signal,
b) a second timing signal having edge transitions controlled by the first timing signal at times determined by a logical combination of the delayed clock signals from the first and second delay lines, and
c) a third timing signal having edge transitions controlled by the second timing signal at times determined by one of the delayed clock signals from the first and second delay lines; and
a controller to change at least one of the first and second amounts of time in the delay lines, to adjust a position of at least one of the first and second edges of the third timing signal.

31. A signal processor, comprising:
a first circuit to receive a first timing signal and to generate a second timing signal having edge transitions controlled by the first timing signal at times determined by a logical combination of first and second delayed clock signals, and
a second circuit to generate a third timing signal having edge transitions controlled by the second timing signal at times determined by one of the first and second delayed clock signals, wherein the first timing signal has a period which is a number of times longer than the clock signal.

32. The signal processor of claim 31, wherein the first circuit controls the edge transitions of the second timing signal at times when the first and second delayed clock signals have a same logical value.

33. A signal processor, comprising:
a first circuit to receive a first timing signal and to generate a second timing signal having edge transitions controlled by the first timing signal at times determined by a logical combination of first and second delayed clock signals, and
a second circuit to generate a third timing signal having edge transitions controlled by the second timing signal at times determined by one of the first and second delayed clock signals, wherein the second timing signal determines which one of the delayed clock signals controls when the second circuit sets an edge transition of the third timing signal.

34. A method, comprising:
generating a second timing signal having edge transitions controlled by a first timing signal at times determined by a logical combination of first and second delayed clock signals; and
generating a third timing signal having edge transitions controlled by the second timing signal at times determined by one of the first and second delayed clock signals wherein the first timing signal has a period which is a number of times longer than the clock signal.

35. A method, comprising:
generating a second timing signal having edge transitions controlled by a first timing signal at times determined by a logical combination of first and second delayed clock signals; and
generating a third timing signal having edge transitions controlled by the second timing signal at times determined by one of the first and second delayed clock signals, wherein the edge transitions of the second timing signal are controlled at times when the first and second delayed clock signals have a same logical value wherein the first timing signal has a period which is a number of times longer than the clock signal.

36. A method, comprising:
generating a second timing signal having edge transitions controlled by a first timing signal at times determined by a logical combination of first and second delayed clock signals; and
generating a third timing signal having edge transitions controlled by the second timing signal at times determined by one of the first and second delayed clock signals, wherein the second timing signal determines which one of the delayed clock signals controls when the second circuit sets an edge transition of the third timing signal.

37. A system, comprising:
a first circuit; and
a second circuit coupled to the first circuit, the second circuit comprising:
a) a first delay line to delay a clock signal by a first amount of time;
b) a second delay line to delay the clock signal by a second amount of time;
c) a signal processor to generate:
a first timing signal from the clock signal,
a second timing signal having edge transitions controlled by the first timing signal at times determined by a logical combination of the delayed clock signals from the first and second delay lines, and
a third timing signal having edge transitions controlled by the second timing signal at times determined by one of the delayed clock signals from the first and second delay lines, wherein the timing signal controls operation of the first circuit, wherein the first timing signal has a period which is a number of times longer than the clock signal.

38. The system of claim 37, wherein the first circuit is one of a processor, power supply, graphical interface, chipset, memory, and network interface.

* * * * *